(12) United States Patent
Iesaka

(10) Patent No.: US 7,212,241 B2
(45) Date of Patent: May 1, 2007

(54) SOLID-STATE IMAGING DEVICE AND METHOD FOR DRIVING THE SAME

(75) Inventor: Mamoru Iesaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 725 days.

(21) Appl. No.: 10/142,755

(22) Filed: May 9, 2002

(65) Prior Publication Data

US 2003/0011698 A1   Jan. 16, 2003

(30) Foreign Application Priority Data

May 9, 2001   (JP)   ............................ P2001-138530
Mar. 27, 2002   (JP)   ............................ P2002-087476

(51) Int. Cl.
*H04N 3/14*   (2006.01)
*H04N 5/335*   (2006.01)

(52) U.S. Cl. ...................... 348/320; 348/294; 348/312; 348/322

(58) Field of Classification Search ................ 348/308, 348/307, 242, 243, 248, 294, 302; 257/291, 257/292, 288
See application file for complete search history.

(56) References Cited

U.S. PATENT DOCUMENTS

| | | | | |
|---|---|---|---|---|
| 5,192,990 A | * | 3/1993 | Stevens | 257/229 |
| 5,498,887 A | * | 3/1996 | Ohki et al. | 257/239 |
| 5,966,172 A | * | 10/1999 | Tsunai | 348/241 |
| 6,465,819 B2 | * | 10/2002 | Furumiya | 257/215 |
| 6,498,332 B2 | * | 12/2002 | Funakoshi | 250/208.1 |
| 6,770,861 B2 | * | 8/2004 | Hagihara | 250/208.1 |
| 6,862,041 B2 | * | 3/2005 | Haraguchi | 348/311 |
| 2001/0033337 A1 | * | 10/2001 | Sakuragi | 348/302 |

FOREIGN PATENT DOCUMENTS

| | | |
|---|---|---|
| JP | 03-286671 | 12/1991 |
| JP | 05-103272 | 4/1993 |
| JP | 08-023478 | 1/1996 |
| JP | 2000-244820 | 9/2000 |
| JP | 2001-02-23 | 2/2001 |
| JP | 2002190729 A * | 7/2002 |

OTHER PUBLICATIONS

Japanese Office Action dated Sep. 4, 2006.

* cited by examiner

*Primary Examiner*—Ngoc-Yen Vu
*Assistant Examiner*—Gregory Madden
(74) *Attorney, Agent, or Firm*—Sonnenschein Nath & Rosenthal LLP

(57) ABSTRACT

A solid-state imaging device comprises, on a semiconductor substrate, a plurality of sensor sections for storing a signal charge commensurate with a quantity of reception light, a charge transfer section for transferring and outputting the signal charge of the sensor sections, and an output section for converting the signal charge transferred by the charge transfer section into an imaging signal for output. A current controller is provided to cut off or reduce a current flowing to the output section in a signal storage period of the sensor section. This cuts off or reduces the current flowing to the output section in a signal storage period of the sensor section, and hence suppresses the amount of the current flowing to the output section in the signal storage period. Thus, wasteful consumption power is greatly reduced.

12 Claims, 6 Drawing Sheets

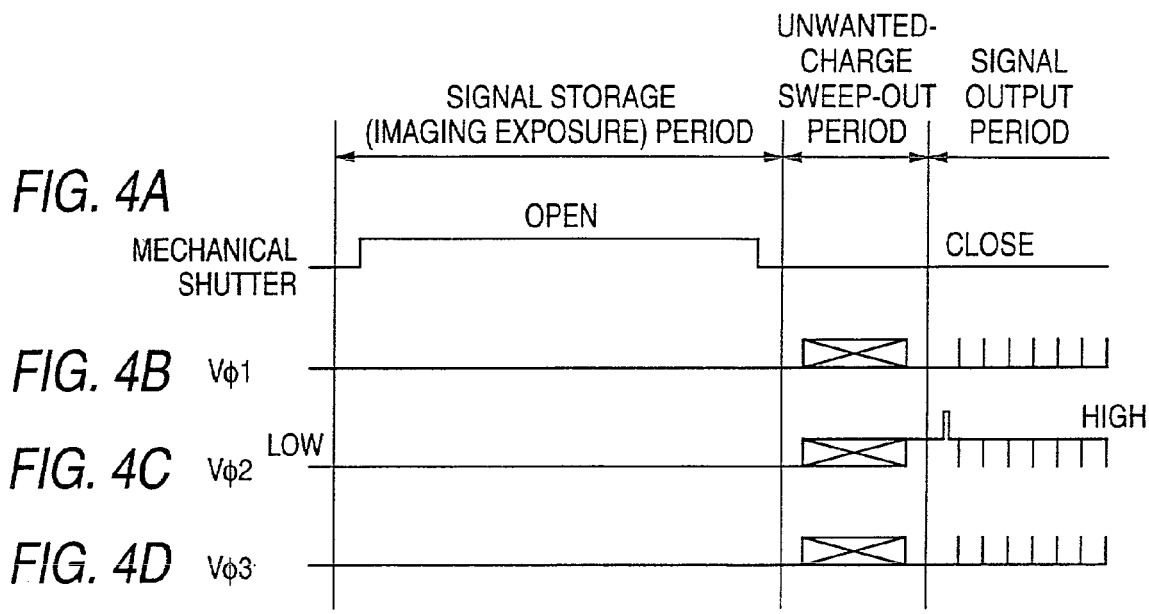
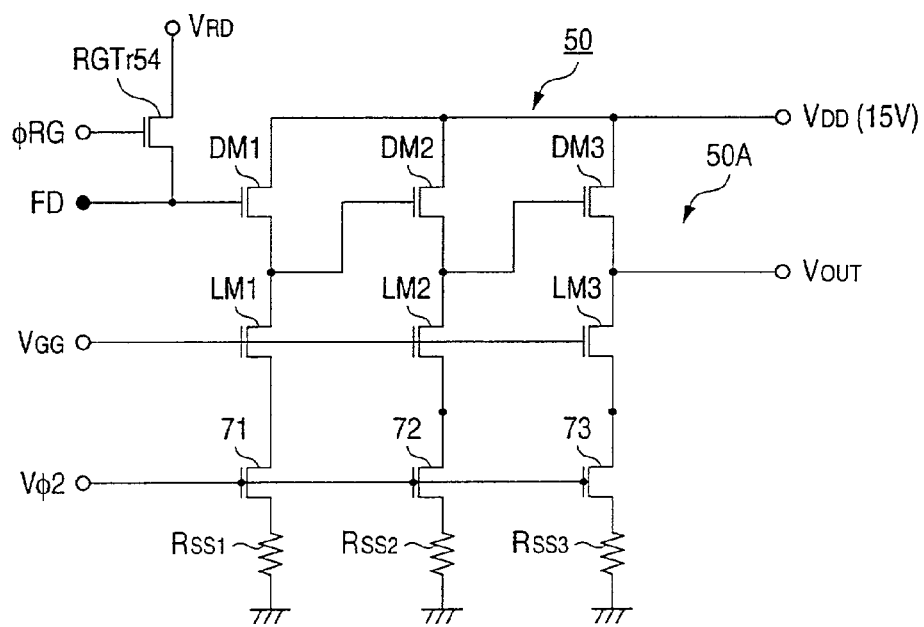

SOLID-STATE IMAGING DEVICE AND METHOD FOR DRIVING THE SAME

RELATED APPLICATION DATA

The present application claims priority to Japanese Application(s) No(s). P2001-138530 filed May 9, 2001, and P2002-087476 filed Mar. 27, 2002, which application(s) is/are incorporated herein by reference to the extent permitted by law.

DESCRIPTION OF THE RELATED ART

CCD solid-state imagers are broadly used, as image input terminals, not only in digital still cameras (DSCs) but also in digital video cameras (DVCs), PC cameras and PDA terminal cameras, for example. Meanwhile, CCD solid-state imagers include, in kind, FF (full frame)-CCDs, FT(frame transfer)-CCDs, IT(interline transfer)-CCDs and FIT-(frame interline transfer)-CCDs.

For example, the IT-CCD area sensor has a multiplicity of photocells (sensor sections) arranged in a two-dimensional matrix form (rows). A plurality of vertical transfer CCDs (V registers) are arranged respectively between vertical columns of photocells, to provide a structure having, usually, one line of horizontal transfer CCDs adjacent to transfer destination ends of vertical transfer CCDs. The IT-CCD area sensor uses a two-phase, three-phase or four-phase drive scheme in transfer-driving the vertical transfer CCDS, wherein the storage modes include a field storage mode and a frame storage mode.

FIG. 1 is a schematic diagram showing a related art of a solid-state imager configured with a CCD solid-state imaging device and an external circuit. The CCD solid-state imaging device 3 configuring the solid-state imager 1 has, on a semiconductor substrate 10, a multiplicity of sensor sections (photocells) 20, e.g. of photodiodes as an example of light-receiving elements corresponding to a pixel (unit cell), arranged vertically (rows) and horizontally (columns) in a two-dimensional matrix form. The sensor sections 20 convert the light incident on a light-receiving surface into a signal charge in an amount commensurate with the light quantity thereof, and store it thereon.

Meanwhile, the CCD solid-state imaging device 3 is arranged with V registers (vertical CCDs, vertical transfer sections) 30, corresponding to the respective vertical rows of sensor sections 20, having a plurality (in this example, three per unit cell) of vertical transfer electrodes $V\phi1$–$V\phi3$ corresponding to the three-phase driving.

Each vertical transfer electrode $V\phi1$–$V\phi3$ (denoted with the same references as the vertical transfer pulses hereinafter referred) has a repetition in transfer direction based on one pixel (i.e. unit cell) of the sensor section 20. Transfer is vertical in FIG. 1, in which direction the V registers 30 are arranged. Furthermore, between the V register 30 and the sensor section 20, a read-out gate terminal ROG is interposed. Channel stops CS are provided in each boundary between the unit cells.

Furthermore, an H register (horizontal CCD, horizontal transfer section) 40 is provided in one line extending left and right in the figure in a position adjacent to the transfer-destination ends of a plurality of the V registers 30. The H register 40 has, at its transfer-destination end (left in the figure), an output section (output buffer circuit) 50, e.g. in a floating diffusion amplifier configuration. The output section 50 converts the signal charge sequentially injected from the H register 40 into a signal voltage for output.

A drain voltage $V_{DD}$, gate voltage $V_{GG}$ and reset drain voltage $V_{RD}$ are applied to the CCD solid-state imaging device 3 from a drive power source 70 configuring an external circuit 5.

The signal charge stored on each sensor section 20 is read onto the V register 30 through the read-out gate terminal ROG by deepening the potential on the gate terminal electrode due to application of a read pulse $X_{SG}$, issued from a timing generator 80 configuring the external circuit 5, to the gate terminal electrode of the read-out gate terminal ROG.

The V register 30 is transfer-driven on an all-pixel read-out scheme (non-interlace scheme), e.g. due to three-phase vertical transfer pulses $V\phi1$–$V\phi3$ mutually different in phase corresponding to the vertical transfer electrodes $V\phi1$–$V\phi3$. The signal charge read out of each sensor section 20 is sequentially, vertically transferred to the H register 40 in an amount corresponding to one scanning line (one line) at one time in a part of horizontal blanking period. Note that the configuration may be by two-phase or four-phase driving without limited to three-phase.

The H register 40 sequentially, horizontally transfers to the output section 50 the signal charge corresponding to one line vertically transferred from each of the V registers 30, on the basis of two-phase horizontal transfer pulses $H\phi1$, $H\phi2$ issued from the timing generator 80.

The output section 50 stores the signal charge sequentially injected from the H register 40 to a not-shown floating diffusion, and converts the stored signal charge into a signal voltage. The signal voltage is outputted as an imaging signal (CCD output signal) through a not-shown output circuit of a source follower configuration, under the control of a reset pulse $\phi RG$ issued from the timing generator 80.

Namely, in the CCD solid-state imaging device 3, the signal charge detected in the image area arranging the sensor sections 20 vertically and horizontally in a two-dimensional form is vertically transferred to the H register 40 by the V register 30 provided correspondingly to the vertical columns of sensor sections 20. The signal charge is then horizontally transferred by the H register 40. Then, a potential is caused correspondingly to the signal charge from the H register 40 and outputted through the output section 50, which operation is repeated.

FIG. 2 is a circuit diagram showing a configuration example of the output section 50 in the CCD solid-state imaging device. The output section 50 configures a front-staged output section (preamplifier) of an incorporated type in the CCD solid-state imaging device. This has a three-stage source follower (current amplifier circuit) configuration having drive MOS transistors (DM: Drive MOS) DM1, DM2, DM3 and load MOS transistors (LM: Load MOS) LM1, LM2, LM3, to provide a signal converting section 52 for converting the signal charge from the H register 40 into a voltage signal. Meanwhile, the output section 50 has a reset gate terminal MOS transistor (RGTr) 54 to control the signal converting section 52 on the basis of a reset pulse $\phi RG$ corresponding to a horizontal transfer clock.

In the signal converting section 52, there are provided a plurality of stages of amplifier circuits, connecting respectively between the source terminals of the drive MOS transistors DM1, DM2, DM3 and the drain terminals of the load MOS transistors LM1, LM2, LM3, at from an input stage over to an output stage of the signal converting section 52.

The drive MOS transistor DM1 at the extreme input stage initial stage, of among the drive MOS transistors DM1, DM2, DM3 forming the source follower circuit drive transistors, has a gate terminal connected to a floating diffusion terminal FD to be supplied with a signal charge from the H register 40. This is connected with a source terminal of a reset gate terminal MOS transistor 54.

The drain terminal of the same is connected to a power source $V_{DD}$ terminal, e.g. approximately +15 V. The source terminal is connected to a drain terminal of a load MOS transistor LM1 serving as current supplier to the drive MOS transistor DM1. The reset gate terminal MOS transistor 54 has a gate terminal to be supplied with a reset pulse $\phi$RG corresponding to a horizontal synchronization clock from the timing generator 80, and a drain terminal applied with a reset drain voltage $V_{RD}$.

The load MOS transistor LM1 has a gate terminal to receive a constant voltage $V_{GG}$, e.g. approximately 5 V, as a gate terminal bias voltage, and a source terminal grounded through a fixed resistance $R_{SS}$. The MOS transistors DM1, LM1 and the fixed resistance $R_{SS}$ constitute a first-staged source follower circuit.

The source terminal of the drive MOS transistor DM1 is further connected to a gate terminal of a drive MOS transistor DM2 as a drive transistor in the next-staged source follower circuit. The drive MOS transistor DM2 has a drain terminal connected to a power source VDD terminal and a source terminal connected to a drain terminal of a load MOS transistor LM2 serving as current supplier to the MOS transistor DM2. The load MOS transistor LM2 has a gate terminal to receive the foregoing constant voltage $V_{GG}$ and a source terminal grounded through the fixed resistance $R_{SS}$. The MOS transistors DM2, LM2 and the fixed resistance $R_{ss}$ constitute a second-staged source follower circuit.

Similarly, there are provided a drive MOS transistor DM3 corresponding to the drive MOS transistor DM2 and a load MOS transistor LM3 corresponding to the load MOS transistor LM2, to constitute a third-staged source follower circuit.

Namely, the drive MOS transistors DM1, DM2, DM3 have their drain terminals commonly connected to be applied by a drain voltage $V_{DD}$ (=15 V) from the drive power source 70. The load MOS transistors LM1, LM2, LM3 have their source terminals commonly connected and grounded through the source terminal resistance $R_{SS}$. Meanwhile, the load MOS transistors LM1, LM2, LM3 have their gate terminals to be applied by a common gate voltage $V_{GG}$. With this gate voltage $V_{GG}$, the current flowing to the output section 50 is controlled in value. The drive MOS transistor DM3 has a source terminal (i.e. drain terminal of the load MOS transistor LM3) to which an output terminal of the output section 50 is provided to output an imaging signal Vout.

Incidentally, the MOS transistors DM1–DM3, LM1–LM3 are Nch-MOS transistors. The first-staged drive MOS transistor DM1 is an enhancement mode transistor while the other MOS transistors DM2, DM3, LM1–LM3 are depression mode transistors. The MOS transistors DM1–DM3, LM1–LM3 have a P-well being ground.

In the output section 50 thus configured, the potential caused on the FD terminal is reset with a period of a reset pulse $\phi$RG. Due to this, the drive MOS transistors DM1, DM2, DM3 operate in synchronism with a horizontal transfer clock. Upon each reset, the potential caused on the FD terminal is converted into a voltage signal and outputted it as an imaging signal Vout.

In the meanwhile, the solid-state imagers as above have recently been actively merchandised particularly as image sensors for still camera applications. Such an image sensor for a still camera performs signal storage operation in the pixel region for a comparatively long time, differently from the conventional one for a movie camera. For example, in the case of a movie camera, the signal storage time on the pixel is naturally limited in order to achieve a frame rate higher than a certain value, i.e. it is generally $\frac{1}{30}$-th of a second. On the contrary, the still camera, free from restriction in frame rate, is allowed to have an increased signal storage period, i.e. the signal storage operation may be as long as several to several tens of seconds.

In the signal storage period, there is no need to apply a transfer clock pulse to the solid-state imaging device. However, the solid-state imaging device and camera must be placed in a standby state. Thus, the solid-state imaging device, at its VDD and VSUB terminals, is applied with a power voltage. This flows a current to the output section 50 connected to the VDD terminal even during a signal storage period, as mentioned above.

However, because no output operation of a CCD signal is made in this duration, there is, naturally, no need to flow a current for operating the output section 50. Namely, in the foregoing related art, the output section 50 consumes useless power during the signal storage period of the sensor sections 20. Meanwhile, such power consumption causes heat generation within the output section 50, resulting in occurrence of dark output variation in the vicinity of the output section 50. Such dark output variation occurs also in a solid-state imaging device for movie application. However, it is prominent particularly in the still-application device because of its longer storage period, and conspicuous on an imaging picture.

It can be considered as means for resolving the problem to provide a structure that, for example, switching means arranged in the external circuit is controlled to prevent a signal from flowing to the output section during a signal storage period. However, this approach incurs complication in the circuit configuration of a camera system.

SUMMARY OF THE INVENTION

Namely, a solid-state imaging device of the present invention comprises: on a semiconductor substrate, a plurality of sensor sections for storing a signal charge commensurate with a quantity of reception light; a charge transfer section for transferring and outputting the signal charge of the sensor sections; an output section for converting the signal charge transferred by the charge transfer section into an imaging signal for output; whereby a current controller is provided to cut off or reduce a current flowing to the output section in a signal storage period of the sensor section.

A solid-state imager of the invention comprises: a solid-state imaging device having, on a semiconductor substrate, a sensor sections to store a signal charge commensurate with a quantity of reception light in a signal storage period, a charge transfer section to transfer and output a signal charge stored on the sensor sections, and an output section to convert a signal charge transferred by the charge transfer section into an imaging signal for output; the output section of the solid-state imaging device having drive transistors to which a signal voltage or current is applied corresponding to the signal charge, and load transistors having a control input terminal and serving as a current supplier to the drive transistors; a control signal applying section for applying a control signal to the control input terminal of the load transistor to suppress low a current flowing to the output section in the signal storage period and normally operate the output section in an output period of the imaging signal.

A method of driving a solid-state imaging device of the invention having, on a semiconductor substrate, a plurality of sensor sections for storing a signal charge commensurate with a quantity of reception light, a charge transfer section for transferring and outputting the signal charge of the sensor sections, and an output section for converting a signal charge transferred by the charge transfer section into an imaging signal and outputting same, the method of driving a solid-state imaging device characterized in that: a current flowing to the output section is cut off or reduced in a signal storage period of the sensor section.

BRIEF DESCRIPTION OF THE DRAWINGS

FIG. 4 is an explanatory diagram showing an operation timing in the CCD solid-state imaging device according to the invention;

FIG. 5 is a circuit diagram showing a configuration example of an output section in the CCD solid-state imaging device according to the invention;

DETAILED DESCRIPTION OF THE PREFERRED EMBODIMENTS

Embodiments of the present invention will now be explained in detail with reference to the drawings.

Figure 3:
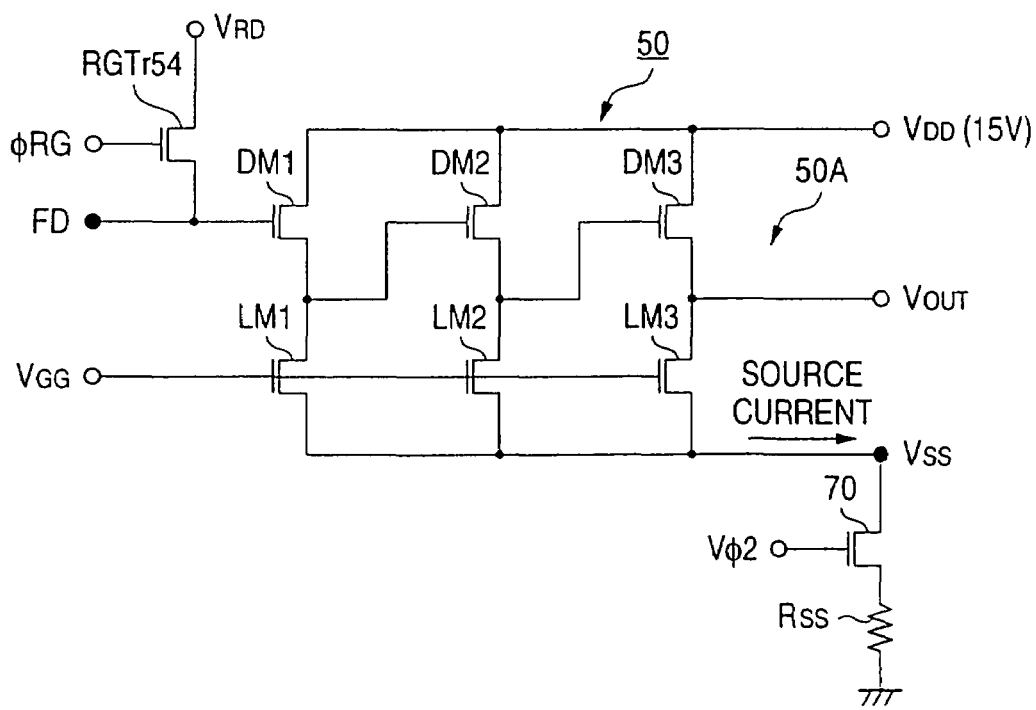
FIG. 3 is a circuit diagram showing a configuration example of an output section in a CCD solid-state imaging device according to a first embodiment of the invention.

FIG. 3 is a circuit diagram showing a configuration example of an output section 50 of a CCD solid-state imaging device according to a first embodiment of the invention.

Figure 1:
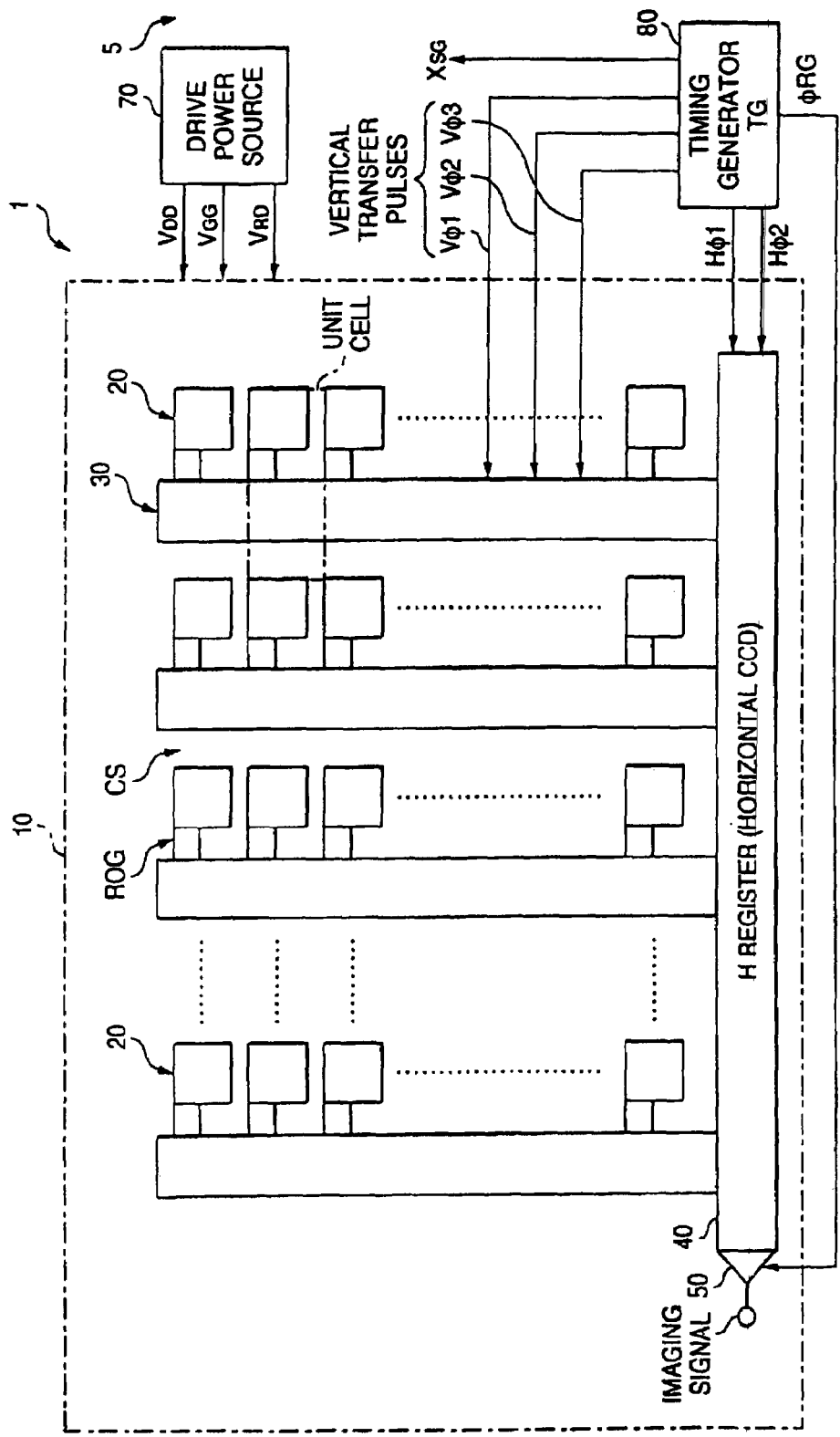
FIG. 1 is a schematic diagram showing a related-art example of a solid-state imager configured with a CCD solid-state imaging device and an external circuit.
Figure 2:
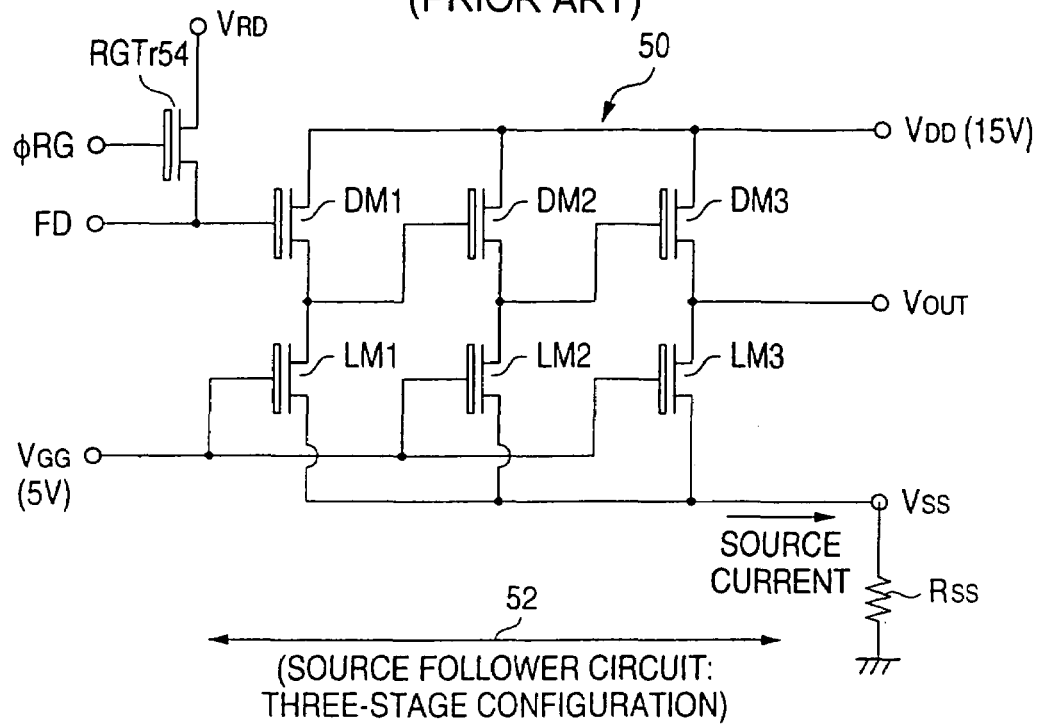
FIG. 2 is a circuit diagram showing a configuration example of an output section in the related-art CCD solid-state imaging device.

The output section is configured with a front-staged output section (preamplifier) incorporated in a solid-state imaging device configured, for example, as shown in FIG. 1. The similar constituent elements to those of the output section shown in FIG. 2 are denoted at the same reference numerals, and hence omittedly explained.

The solid-state imaging device of this embodiment has a current-control MOS transistor (MOS-Tr) 70 provided to the sources of load MOS transistors LM1, LM2, LM3, to control the current flowing to the output section (source current in this case), as shown in FIG. 3. The current-control MOS transistor 70 has a gate to which is applied a control clock pulse substituted with a vertical transfer clock pulse Vφ (Vφ2 used in this embodiment). Due to this, the current is suppressed from flowing to the output section in a signal storage period of the sensor section 20.

The current-control MOS transistor 70 has a drain connected to the sources of the load MOS transistors LM1, LM2, LM3, and a source thereof grounded through a resistance RSS.

With this configuration, the solid-state imaging device of the embodiment uses a drive scheme, as follows. Namely, during a signal storage period of the sensor section 20, the source current to the output section is cut off or suppressed low by a Low bias in the control clock pulse Vφ2. During a signal output period, the control clock pulse Vφ2 is increased to a High bias whereby the current to the output section is increased for normal operation.

FIG. 4 is an explanatory diagram exemplifying a drive timing in the case of taking still pictures by mounting the solid-state imaging device of the embodiment on a still camera. FIG. 4A shows an operation timing of a mechanical shutter while FIGS. 4B, 4C and 4D show an operation timing of three-phase vertical transfer clocks Vφ1, Vφ2 and Vφ3.

In a signal storage period, the mechanical shutter is opened to store a signal charge by the sensor section 20 of the imaging device, as shown in FIG. 4A. Thereafter, the mechanical shutter is closed to end the signal storage.

In the next sweep-out period of unwanted charge, as shown in FIGS. 4B, 4C and 4D, vertical transfer clock pulses are applied at high rate by the respective vertical transfer clocks Vφ1, Vφ2, Vφ3, to expel the unwanted charge staying within the vertical transfer register section.

In the next signal output period, the signal charge accumulated on the sensor section 20 is read out to the vertical transfer register section. Furthermore, the signal charge is transferred through the vertical transfer register and horizontal transfer register sections and outputted to the output section.

In this embodiment, the vertical transfer clock pulse Vφ2 applied to the gate of the current-control MOS transistor 70 is reduced to a Low bias in the signal storage period. Thus, the current-control MOS transistor 70 can be made in a cut-off state or a reduced source-current state.

This can greatly reduce the power consumption in the output section. In addition, because the amount of heat generation in the output section can be naturally decreased, it is possible to greatly decrease the dark output deviation occurring on an imaging picture in the vicinity of the output section.

On the other hand, in the signal output period, the vertical transfer clock pulse Vφ2 is increased to a High bias, to turn on the current-control MOS transistor 70. This can bring the output section into a normal operating state, in that duration. Thus, signal output operation can be normally carried out.

Incidentally, there is a need to provide a channel potential on the current-control MOS transistor 70 small (shallow) in a Low bias state and great (deep) in a High bias state, as compared to the channel potential on the load MOS transistors LM1, LM2, LM3 of the output section.

In order to realize such a state of potential, it is satisfactory to provide a channel potential on the current-control MOS transistor 70 in the same level as or approximate to a potential on a read-out gate used in the vertical transfer register.

Due to this, even in the case of providing a current-control MOS transistor 70, there is no need to newly increase the imaging-device manufacturing process. In other words, where required, process increase may be slight in extent.

As so far explained, in the CCD solid-state imaging device of this embodiment, a current flowing to the output section can be cut off or suppressed low during the signal storage period of the sensor section 20. Also, as shown in FIG. 4C, in the timing the control clock pulse Vφ2 in a horizontal blanking of signal output period assumes a Low bias state, it is possible to cut off or suppress low a current flowing to the output section.

This greatly reduces the power consumption of the output section and decreases the dark output variation caused due to heat generation in the output section.

In obtaining such an effect, there is no need to provide an additional function to the external circuit, such as CCD drive circuit. Furthermore, CCD manufacturing process requires no increase, or increase is slight where needed. Thus, realization is feasible at low cost.

In the above configuration, the current-control MOS transistor 70 and the clock pulse Vφ2 for gate control thereof are satisfactory provided that they realize the effect of the invention. Another form of configuration or timing may be applied.

For example, although the example of FIG. 3 arranged the current-control MOS transistor 70 at the source side of the output section, this can be configured arranged at a drain side.

Meanwhile, although in the example of FIG. 3 the current-control MOS transistor 70 was MOS type, it is possible to employ a Junction-type FET or Bipolar transistor.

Although drive timing was explained on the case with the three-phase vertical transfer register, another vertical transfer register, e.g. four-phase register, can be applied similarly.

In the example of FIG. 3, the current-control MOS transistor 70 was provided to the commonly connected sources of the load MOS transistors LM1, LM2, LM3. Alternatively, independent current-control MOS transistors 71, 72, 73 may be connected respectively to the sources of the load MOS transistors LM1, LM2, LM3 as shown in FIG. 5. Note that, in FIG. 5, the other structure is common to that of FIG. 1 and hence omittedly explained.

Figure 6:
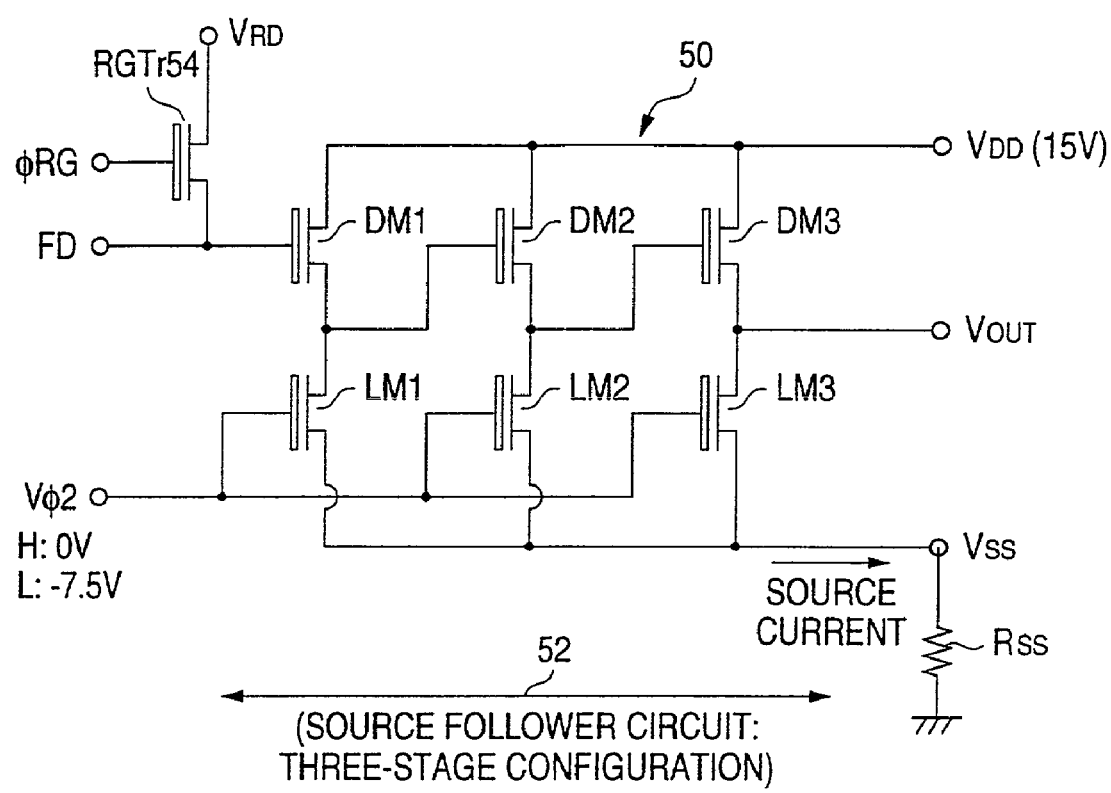
FIG. 6 is a circuit diagram showing a configuration example of an output section in a CCD solid-state imaging device according to a second embodiment of the invention.

FIG. 6 is a circuit diagram of an output section configuring a CCD solid-state imaging device as a major part of a solid-state imager according to a second embodiment of the invention. The output section 50 configures a front-staged output section (preamplifier) incorporated, for example, in the solid-state imaging device shown in FIG. 1. The constituent elements similar to those of the output section 50 shown in FIG. 2 are denoted with the same reference numerals and hence omittedly explained.

In the solid-state imaging device, as shown in FIG. 6, the control signal for controlling the current flowing to the output section 50 (source current control in this case) uses not a fixed voltage $V_{GG}$ but a control clock pulse substituted with a vertical transfer clock pulse Vφ supplied from the timing generator 80 (Vφ2 used in this example) to be directly applied commonly to the gate terminals (control input terminals) of load MOS transistors LM1, LM2, LM3. Due to this, the current is suppressed from flowing to the output section 50 during a signal storage period of the sensor section 20. Namely, the timing generator 80 serves as a control signal applying section of the invention.

The solid-state imaging device thus configured uses a drive method, as follows. Namely, during a signal storage period of the sensor section 20, the control clock pulse Vφ2 is biased Low to cut off or suppress low the source current control of the output section 50. During a signal output period, the control clock pulse Vφ2 is biased High to increase the current of the output section 50 thereby allowing for normal operation.

FIG. 4 is an explanatory diagram showing an example of a drive timing in the case of taking still pictures by mounting the solid-state imaging device of the embodiment on a still camera. FIG. 4A shows an operation timing of a mechanical shutter while FIGS. 4B, 4C and 4D show an operation timing of three-phase vertical transfer clocks Vφ1, Vφ2 and Vφ3.

In a signal storage period, the mechanical shutter is opened to store a signal charge by the sensor section 20 of the imaging device 3, as shown in FIG. 4A. Thereafter, the mechanical shutter is closed to end the signal storage.

In the next sweep-out period of unwanted charge, vertical transfer clock pulses are applied at high rate with the respective vertical transfer clocks Vφ1, Vφ2, Vφ3, to expel the unwanted charge staying within the V transfer register 30, as shown in FIGS. 4B–4D. In the next signal output period, the signal charge accumulated on the sensor section 20 is read onto the V register 30. Furthermore, the signal charge is transferred through an inside of the V register 30 and H register 40 and outputted to the output section.

In this embodiment, the vertical transfer clock pulse Vφ2 applied to the gate terminals of the load MOS transistors LM1, LM2, LM3 is biased Low in the signal storage period. Thus, the load MOS transistors LM1, LM2, LM3 can be made in a cut-off state or a reduced source current control state. This greatly reduces the power consumption in the output section 50. Meanwhile, because the amount of heat generation can be naturally decreased in the output section, it is possible to greatly decrease the dark output deviation occurring on an imaging picture in the vicinity of the output section 50.

On the other hand, in the signal output period, the vertical transfer clock pulse Vφ2 is biased High, to turn on the load MOS transistors LM1, LM2, LM3. This makes the output section 50 in a normal operating state in the signal output period. Thus, signal output can be normally effected.

As so far explained, the CCD solid-state imaging device of this embodiment can cut off or suppress low the current flowing to the output section 50 in the signal storage period of the sensor section 20.

Also, as compared to the scheme arranging, in series, semiconductor elements constituting a signal converting section 52 (MOS transistors in the above example) and switching element, the embodiment is free from voltage drop due to switch elements, allowing for normal operation on a low power voltage $V_{DD}$.

Furthermore, because control is made with a control clock pulse substituted with a vertical transfer clock pulse Vφ (Vφ2 in the above example) to the gate terminals of the load MOS transistors LM1, LM2, LM3, there is no necessity to provide a new switching device as required in Embodiment 1.

Incidentally, the vertical transfer clock pulse Vφ2 has a Low level of approximately "−7.5 V" and a High level of "0 V". Consequently, the load MOS transistors LM1–LM3 in the embodiment must have a characteristic different from that of the load MOS transistors LM1–LM3 to be applied by $V_{GG}$ (≈5 V) to the gate terminal in the related art shown in FIG. 2. Namely, in order to realize a CCD solid-state imaging device of the embodiment, there is a need to somewhat modify the design of the device characteristic of the output section used in the related art.

In the case of controlling the CCD solid-state imaging device by a control clock pulse substituted with a vertical transfer clock pulse Vφ2, the effect is further enhanced by making control not only in the signal storage period but also in a part of horizontal blanking period.

Figure 7:
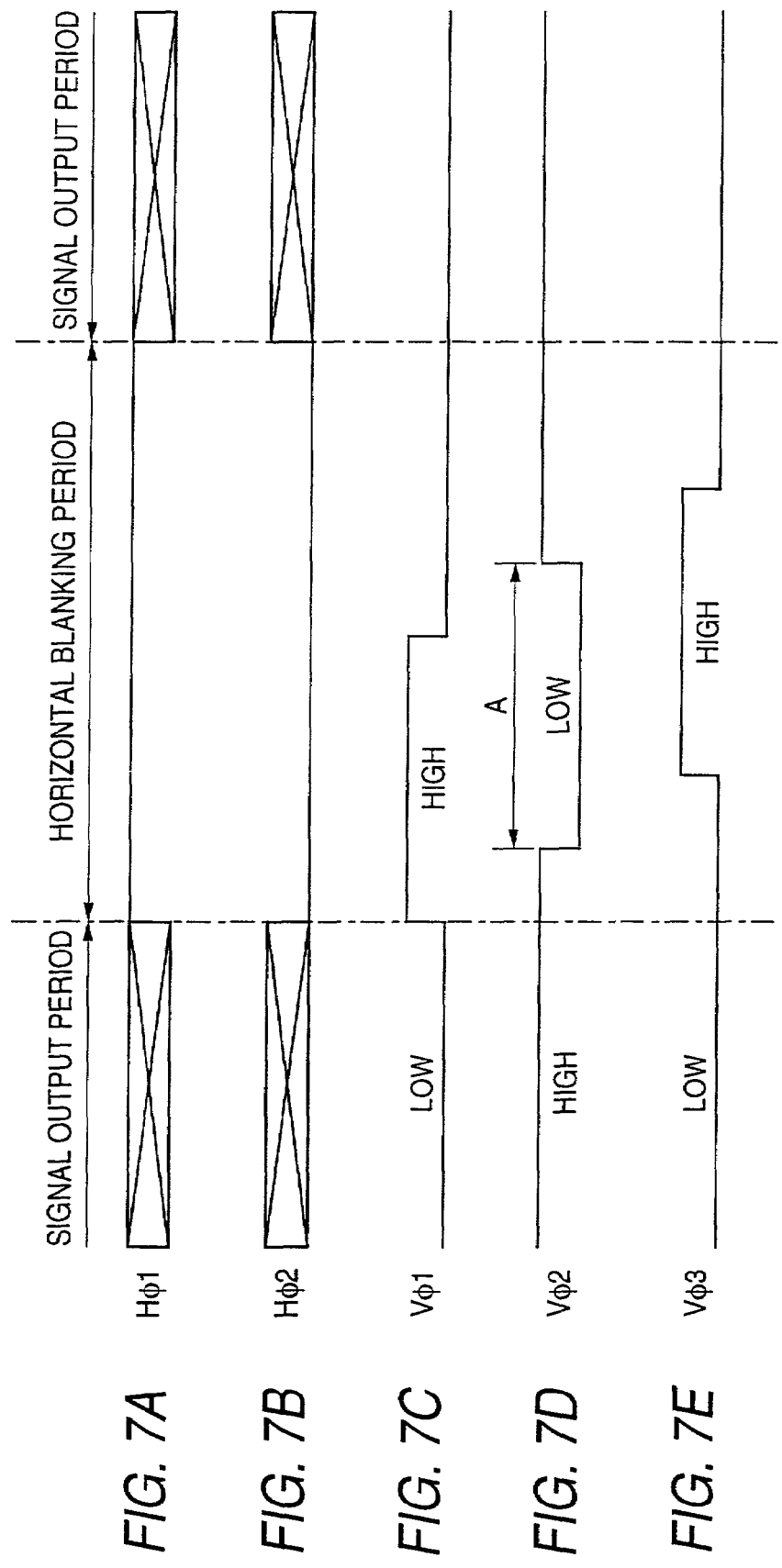
FIG. 7 is a timing chart of vertical transfer clock pulses in a horizontal blanking period.

FIG. 7 is a timing chart of a transfer clock pulse in a horizontal blanking period. Herein, FIGS. 7A and 7B show the operation timing of the respective two-phase horizontal transfer clocks Hφ1, Hφ2. FIGS. 7C, 7D and 7E show the operation timing of the respective three-phase vertical transfer clocks Vφ1, Vφ2, Vφ3.

For vertical line-shift transfer, the vertical transfer clock pulse Vφ2 assumes, without exception, a Low bias state in a certain period A in horizontal blanking during a signal output period. In the timing the vertical transfer clock pulse Vφ2 turns into a Low bias state, the current flowing to the output section 50 can be also cut off or suppressed low.

This greatly reduces power consumption in the output section 50. Furthermore, it is possible to greatly reduce dark output variation to be caused due to heat generation in the output section 50. In obtaining such an effect, there is no need to add an additional function, such as a CCD drive circuit (e.g. drive power source 70 or timing generator 80) to the external circuit 5. Furthermore, there is no or slight need to increase the CCD manufacturing process. Thus, the solid-state imager of the embodiment can be realized at low cost.

Figure 8:
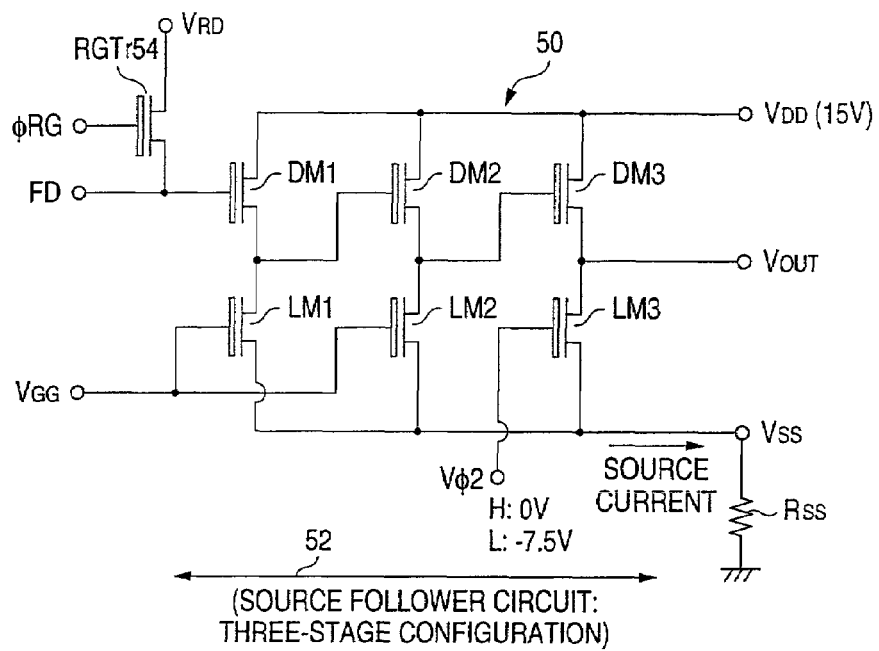
FIG. 8 is a circuit diagram showing a configuration example of an output section in a CCD solid-state imaging device according to a third embodiment of the invention.

FIG. 8 is a circuit diagram showing a third embodiment of an output section configuring a CCD solid-state imaging device as a major part of a solid-state imager of the invention. In the second embodiment, a vertical transfer clock pulse V φ2 was inputted to the gate terminals of all the load MOS transistors LM1, LM2, LM3 of the three-staged source follower circuits in the output section 50 (specifically, signal converting section 52) of the CCD solid-state imaging device. However, there is no need to apply it to all the load MOS transistors. The third embodiment is based on such viewpoint.

Namely, the third embodiment has an output section 50 configured to directly input a vertical transfer clock pulse Vφ2, as a control clock pulse, to only the gate of the load MOS transistor LM3 constituting the final-staged source follower circuit through which the greatest amount of current flows of among the three-staged source follower circuits. The load MOS transistors LM1, LM2 at the front stage are configured to be applied by a common gate voltage $V_{GG}$ (fixed voltage, e.g. +5 V) to the gate terminals thereof, similarly to the related-art configuration shown in FIG. 2.

In also this form, the most part of the source current flowing to the output section 50 flows into the final-staged source follower circuit. By controlling the final-staged gate terminal with using a control clock pulse substituted with a vertical transfer clock pulse Vφ2, it is possible to enjoy such effects as the reduction of power consumption in the output section 50, the decrease in the dark output deviation caused on an imaging picture in the vicinity of the output section 50 or so, similarly to Embodiment 2. Device characteristic change can be retained only to the final-staged load MOS transistor LM3.

Figure 9:
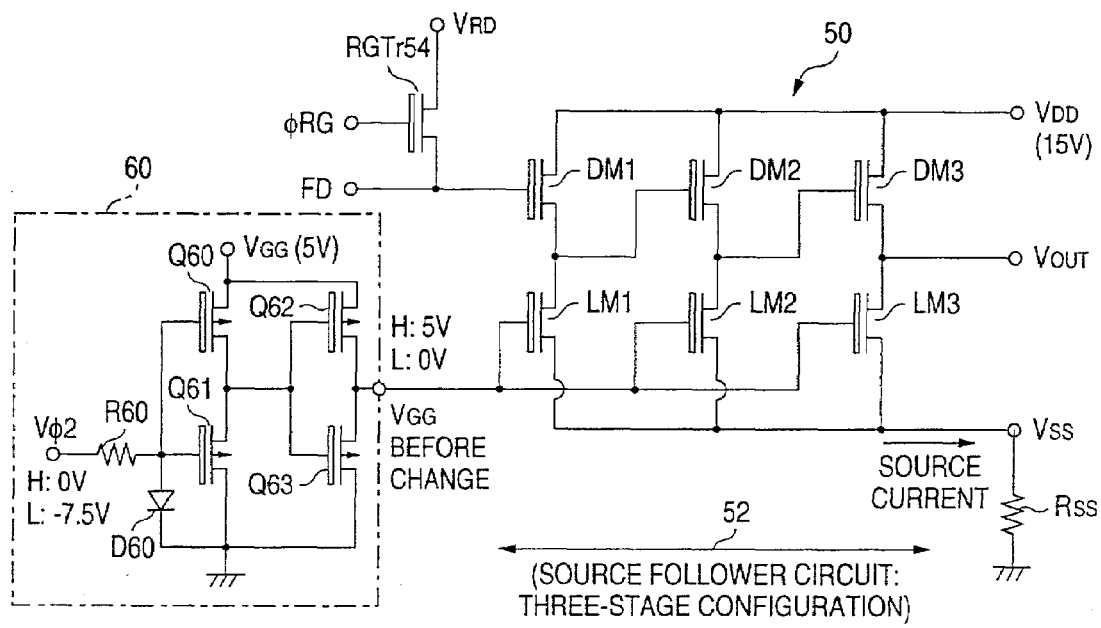
FIG. 9 is a circuit diagram showing a fourth embodiment of a solid-state imager according to the invention.

FIG. 9 is a circuit diagram showing a fourth embodiment of a solid-state imager of the invention. As already explained in the second or third embodiment, where a vertical transfer clock pulse Vφ2 is directly inputted, as a control clock pulse, to the gate terminals of the load MOS transistors LM1, LM2, LM3, the device characteristic of them must be made different from that of the related-art configuration. The fourth embodiment is configured to input, as a control clock pulse, a signal corresponding to a vertical transfer clock pulse Vφ2 to the gate terminal without requiring change to the device characteristic.

Namely, the solid-state imager in the fourth embodiment has, as an external circuit 5, a level converter circuit 60 to convert a signal level of a vertical transfer clock pulse Vφ2 for driving the V register 30. The level converter circuit 60 converts a signal level of a vertical transfer clock pulse Vφ2 inputted from the timing generator 80 into a level suited for an input level to the gate terminals of the load MOS transistors LM1, LM2, LM3 having a characteristic similar to that of the related art.

The level converter circuit 60 inputs a level-converted pulse, as a control clock pulse, to the gate terminals (shown at the $V_{GG}$ before change, in FIG. 9) of the load MOS transistors LM1, LM2, LM3 of a CCD solid-state imaging device same as the related-art configuration. Namely, the fourth embodiment constitutes a control signal applying section of the invention by the timing generator 80 and the newly provided level converter circuit 60.

The level converter circuit 60, in an example shown, is a non-inverter type of a two-stage structure having complementary-connected MOS transistors Q60, Q61 and MOS transistors Q62, Q63 between a gate voltage $V_{GG}$ and a ground. A vertical transfer clock pulse Vφ2, having Low level "−7.5 V" and High level "0 V", inputted to a gate connection point of the input-end MOS transistors Q60, Q61 through a resistance R60, is limited in amplitude level to $V_{BE}$ (forward diode voltage) by the diode D60. This is converted into a pulse having Low level "0 V" and High level "5 V" and outputted onto an output end of the output-end MOS transistors Q62, Q63.

As in this fourth embodiment, by interposing a level converter circuit 60 between the timing generator 80 and the output section 50 of the CCD solid-state imaging device, it is possible to use a CCD solid-state imaging device having an output section same in characteristic as the related art. Due to this, while using the existing output section optimized (i.e. CCD solid-state imaging device), it is possible to enjoy such effects as the reduction in power consumption at the output section and the decrease in dark output variation caused on an imaged picture in the vicinity of the output section, similarly to the second and the third embodiments.

Although the invention was so far explained using the embodiments, the technical scope of the invention is not limited to the described embodiments. Various changes or modifications can be added to the embodiments, wherein such change or modification be included in the technical scope of the invention. Meanwhile, the embodiment is not to delimit the claimed invention. The features explained in the embodiments, in every combination, are not necessarily requisite for the solving means of the invention.

For example, although the embodiment explained the example that a control clock pulse (control signal) for controlling the gate terminals of the load MOS transistors LM1, LM2, LM3 is substituted with a vertical transfer clock pulse Vφ (Vφ2 in the above example), the invention is not limited to this but is satisfactory if realizing the effect of the invention. Namely, the control signal may suppress low the current flowing to the output section in a signal storage period and normally operate the output section in an imaging-signal output period wherein the timing may be different from that of the vertical transfer clock pulse Vφ.

The configuration of the signal converter section is not limited to a three-staged source follower circuits having MOS transistors but may be in another configuration, e.g. may be a one-stage, two-stage or four-stage or more of structure. Meanwhile, junction-type FETs or bipolar transistors may be used without limited to MOS transistors.

Although the fourth embodiment showed the example that the level converter circuit was provided as an external circuit of the CCD solid-state imaging device, the level converter circuit may be arranged on a semiconductor substrate and integrated with the CCD solid-state imaging device.

Although the drive timing to the V register was explained on the three-phase vertical transfer register, the invention can be similarly practiced with four-phase or other vertical transfer registers.

Furthermore, although the embodiment explained the example with the area sensor arranged with sensor sections 20 in a matrix form (two-dimensional form), a line sensor may be applied without limited to that.

Meanwhile, it is needless to say that the circuits described in the embodiments can be altered to those in a complimentary relationship with them.

As described above, the present invention is adapted to cut off or reduce the current flowing to the output section in a signal storage period of the sensor section, and hence can suppress the amount of the current flowing to the output section in the signal storage period. Thus, wasteful consumption power is greatly reduced.

Also, by suppressing the amount of the current flowing to the output section in the signal storage period of the sensor section, heat generation is suppressed in the vicinity of the output section to prevent against dark output variation.

What is claimed:

1. A solid-state imaging device comprising, on a semiconductor substrate:
   a plurality of sensor sections each of which is configured to store a signal charge commensurate with a quantity of received light within a signal storage period;
   a charge transfer section configured to transfer and output the signal charges of each of the sensor sections to an output section;
   the output section which is configured to convert each signal charge transferred by the charge transfer section into an imaging signal for output; and
   a current controller which is configured to cut off or reduce current flowing to the output section from the charge transfer section during a signal storage period of the sensor section,
   wherein,
   the output section comprises:
   (a) a signal converting section having amplifier circuits each of which comprises a drive transistor and a load transistor connected in series an input stage and an output stage of the output section, the gate of the drive transistor of the first amplifier in the series being coupled to a floating diffusion terminal for supplying a signal charge to the gate of the drive transistor, the source of the drive transistor of each preceding amplifier circuit being connected to the gate of the drive transistor of the immediately following amplifier circuit in the series in a next stage in a repeated fashion, and the source of the drive transistor of the last amplifier circuit in the series being couple to an output terminal for an imaging signal; and
   (b) a reset gate control section coupled to the gate of the drive transistor of the first amplifier circuit in the signal converting section and configured to issue a reset gate signal depending upon a transfer clock,
   the current controller has a switching element operatively configured to control current flowing to the load transistors of the amplifier circuits of the output section,
   the switching element is a MOS transistor, and
   the MOS transistor has a channel potential same as or operatively substantially the same as a potential on a transfer gate of the charge transfer section.

2. A solid-state imaging device comprising, on a semiconductor substrate:
   a plurality of sensor sections each of which is configured to store a signal charge commensurate with a quantity of received light within a signal storage period;
   a charge transfer section configured to transfer and output the signal charges of each of the sensor sections to an output section;
   the output section which is configured to convert each signal charge transferred by the charge transfer section into an imaging signal for output; and
   a current controller which is configured to cut off or reduce current flowing to the output section from the charge transfer section during a signal storage period of the sensor section,
   wherein,
   the charge transfer section includes a vertical charge transfer section to vertically transfer a signal charge of the sensor section depending upon a vertical transfer clock and a horizontal charge transfer section to transfer a signal charge transferred by the vertical charge transfer section to the output section depending upon a horizontal transfer clock, and
   the current controller is controlled by a control signal for the vertical transfer clock to thereby cut off or reduce a current flowing to the output section during the signal storage period.

3. A solid-state imaging device comprising, on a semiconductor substrate:
   a plurality of sensor sections each of which is configured to store a signal charge commensurate with a quantity of received light within a signal storage period;
   a charge transfer section configured to transfer and output the signal charges of each of the sensor sections to an output section;
   the output section which is configured to convert each signal charge transferred by the charge transfer section into an imaging signal for output; and
   a current controller which is configured to cut off or reduce current flowing to the output section from the charge transfer section during a signal storage period of the sensor section,
   wherein,
   the output section has drive transistors to which a voltage or current signal corresponding to the signal charge is applied and load transistors having a control input terminal and serving as a current supplier to the drive transistors,
   the current controller applying a control signal to the control input terminal of the load transistors such that a current flowing to the output section is suppressed low in the signal storage period and the output section is normally operated in an output period of the imaging signal, and
   the control signal is applied only to the control input terminal of the load transistor of the last amplifier circuit in the series of output section amplifier circuits.

4. A solid-state imaging device comprising, on a semiconductor substrate:
   a plurality of sensor sections each of which is configured to store a signal charge commensurate with a quantity of received light within a signal storage period;
   a charge transfer section configured to transfer and output the signal charges of each of the sensor sections to an output section;

the output section which is configured to convert each signal charge transferred by the charge transfer section into an imaging signal for output; and a current controller which is configured to cut off or reduce current flowing to the output section from the charge transfer section during a signal storage period of the sensor section, wherein, the output section has drive transistors to which a voltage or current signal corresponding to the signal charge is applied and load transistors having a control input terminal and serving as a current supplier to the drive transistors, the current controller applying a control signal to the control input terminal of the load transistors such that a current flowing to the output section is suppressed low in the signal storage period and the output section is normally operated in an output period of the imaging signal, the sensor sections are arranged in a two-dimensional matrix, the charge transfer section has a vertical transfer section provided for each vertical column of the sensor sections arranged in the two-dimensional matrix form and a horizontal transfer section provided adjacent to transfer destination ends of the vertical transfer sections, and the control input terminal of the load transistor of the output section is configured to receive, as the control signal, a vertical transfer pulse which also is used for driving the vertical transfer section.

5. A solid-state imager comprising a solid-state imaging device having, on a semiconductor substrate, a sensor section to store a signal charge commensurate with a quantity of light received during a signal storage period, a charge transfer section to transfer and output a signal charge stored on the sensor sections, and an output section configured to convert and output a signal charge transferred by the charge transfer section into an imaging signal, the output section of the solid-state imaging device having drive transistors to which a voltage or current signal corresponding to the signal charge is applied, and load transistors having a control input terminal and serving as a current supplier to the drive transistors; and a control signal applying section configured to apply a control signal to the control input terminal of the load transistor to suppress current flowing to the output section during the signal storage period and allow the output section in to otherwise operate normally during an output period of the imaging signal, wherein, the solid-state imaging device has a plurality of sensor sections arranged in a two-dimensional matrix in a vertical and horizontal direction, and the charge transfer section includes a vertical transfer section provided for each vertical column of the sensor sections and a horizontal transfer section adjacent to transfer destination ends of the vertical transfer sections, and the control signal applying section applies, as the control signal, a vertical transfer pulse for driving the vertical driving section to a control input terminal of the load transistor of the output section.

6. A solid-state imager according to claim 5, wherein the control signal applying section makes the vertical transfer pulse in a Low bias state to suppress current flowing to the output section in a portion of a horizontal blanking period, and the vertical transfer pulse in a High bias state to the output section to operate normally during the output period of the imaging signal.

7. A solid-state imager comprising a solid-state imaging device having, on a semiconductor substrate, a sensor section to store a signal charge commensurate with a quantity of light received during a signal storage period, a charge transfer section to transfer and output a signal charge stored on the sensor sections, and an output section configured to convert and output a signal charge transferred by the charge transfer section into an imaging signal, the output section of the solid-state imaging device having drive transistors to which a voltage or current signal corresponding to the signal charge is applied, and load transistors having a control input terminal and serving as a current supplier to the drive transistors; and a control signal applying section configured to apply a control signal to the control input terminal of the load transistor to suppress current flowing to the output section during the signal storage period and allow the output section in to otherwise operate normally during an output period of the imaging signal, wherein, the control signal applying section has a level converting section to convert a signal level of a vertical transfer pulse for driving the vertical transfer section into a level suited for an input level to the control input terminal of the load transistor, and a vertical transfer pulse level-converted by the level converting section is applied as the control signal to the control input terminal of the load transistor.

8. A method of driving a solid-state imaging device having, on a semiconductor substrate, a plurality of sensor sections for storing signal charges commensurate with a quantity of r light received, a charge transfer section for transferring and outputting the signal charges of the sensor sections, and an output section for converting and outputting a signal charge transferred by the charge transfer section into an imaging signal, the method of driving a solid-state imaging device characterized in that:

a current flowing to the output section from the charge transfer section is cut off or reduced during a signal storage period of the sensor section, providing a signal converting section configured to have a series of amplifier circuits, each having a drive transistor and a load transistor in series, in a plurality of stages extending in series from an input stage over to an output stage of the output section, connecting a floating diffusion terminal for supplying a signal charge to a gate of the drive transistor of the input stage, connecting a source of the drive transistor of a preceding amplifier circuit in the series to a gate of the drive transistor in a following stage, configuring a source of the drive transistor at the output stage of the series as an output terminal for the imaging signal;

providing a reset gate control section for resetting a gate input of the input stage drive transistor depending upon a transfer clock, providing a switching element for control of source current of the sources of the load transistors of the signal converting section, the switching element configured to off or reduce current flowing to the output section during a signal storage period of the sensor section, vertically transferring signal charges of the sensor section via a vertical charge transfer section depending upon a vertical transfer clock and horizontally transferring signal charges transferred by the vertical charge transfer section to the output via a horizontal charge transfer section depending upon a horizontal transfer clock, and controlling the switching element with the control signal for a vertical transfer clock thereby cutting off or reducing a current flowing to the output section during the signal storage period.

9. A method of driving a solid-state imaging device having, on a semiconductor substrate, a plurality of sensor sections for storing signal charges commensurate with a quantity of r light received, a charge transfer section for transferring and outputting the signal charges of the sensor sections, and an output section for converting and outputting a signal charge transferred by the charge transfer section into an imaging signal, the method of driving a solid-state imaging device, said method comprising the steps of:

cutting off or reducing a current flowing to the output section from the charge transfer section during a signal storage period of the sensor section;

applying a voltage or current signal to output section drive transistors in correspondence with the signal charge, and output section load transistors having a control input terminal and serving as a current supplier to the drive transistor; and applying a control signal a control input terminal of an output section load transistor to suppress current flowing to the output section from the charge transfer section during the signal storage period, wherein, the output section comprises a plurality of amplifier circuits connected in series, each having a drive transistor and a load transistor connected in series;

the control signal is applied only to the control input terminal of the load transistor of the last amplifier circuit in the series.

10. A method of driving a solid-state imaging device having, on a semiconductor substrate, a plurality of sensor sections for storing signal charges commensurate with a quantity of r light received, a charge transfer section for transferring and outputting the signal charges of the sensor sections, and an output section for converting and outputting a signal charge transferred by the charge transfer section into an imaging signal, the method of driving a solid-state imaging device, said method comprising the steps of:

cutting off or reducing a current flowing to the output section from the charge transfer section during a signal storage period of the sensor section;

applying a voltage or current signal to output section drive transistors in correspondence with the signal charge, and output section load transistors having a control input terminal and serving as a current supplier to the drive transistor; and applying a control signal a control input terminal of an output section load transistor to suppress current flowing to the output section from the charge transfer section during the signal storage period, wherein, the sensor sections are arranged in a two-dimensional matrix in a vertical and horizontal direction, and the charge transfer section includes a vertical transfer section provided for each vertical column of the sensor sections and a horizontal transfer section provided adjacent transfer destination ends of the vertical transfer sections, and a vertical transfer pulse for driving the vertical transfer section is applied as the control signal to a control input terminal of the load transistors of the output section.

11. A method of driving a solid-state imaging device according to claim 10, wherein the vertical transfer pulse is generated in a Low bias state to suppress current flowing to the output section during a portion of a horizontal blanking period, and the vertical transfer pulse is generated in a High bias state to the output section to operate normally during the output period of the imaging signal.

12. A method of driving a solid-state imaging device according to claim 10, wherein a signal level of a vertical transfer pulse for driving the vertical transfer section is converted into a level suited for an input level to the control input terminal of the load transistor, and a vertical transfer pulse level-converted is applied as the control signal to the control input terminal of the load transistor.

* * * * *